(12) United States Patent
Hughes

(10) Patent No.: US 8,375,236 B2
(45) Date of Patent: Feb. 12, 2013

(54) METHODS FOR DETERMINING BATTERY STATISTICS USING A SYSTEM-WIDE DAEMON

(75) Inventor: Richard Hughes, London (GB)

(73) Assignee: Red Hat, Inc., Raleigh, NC (US)

( * ) Notice: Subject to any disclaimer, the term of this patent is extended or adjusted under 35 U.S.C. 154(b) by 367 days.

(21) Appl. No.: 12/535,139

(22) Filed: Aug. 4, 2009

(65) Prior Publication Data

US 2011/0035614 A1    Feb. 10, 2011

(51) Int. Cl.
*G06F 1/00* (2006.01)
*G06F 11/30* (2006.01)

(52) U.S. Cl. ........................................ 713/340

(58) Field of Classification Search .................. 713/340; 320/132
See application file for complete search history.

(56) References Cited

U.S. PATENT DOCUMENTS

| 6,545,448 | B1 * | 4/2003 | Stanley et al. | 320/132 |
| 7,208,914 | B2 * | 4/2007 | Klang | 320/132 |
| 2008/0218126 | A1 * | 9/2008 | Bansal et al. | 320/132 |
| 2011/0029979 | A1 * | 2/2011 | Teshome et al. | 718/103 |

OTHER PUBLICATIONS

Juergen Haas, Linux/Unix Command:apmd, Oct. 2, 2007, about.com, pp. 1-2.*
"Fedora 11 Installation Guide: Installing Fedora 11 on x86, AMD64, and Intel® 64 architectures," Ed. 1.0, Fedora Documentation Project, fedora-docs-list@redhat.com, Red Hat, Inc. and others, 2009, 274 pages.
"Fedora 11 User Guide: Using Fedora 11 for common desktop computing tasks," Ed. 1.0, Fedora Documentation Project, fedora-docs-list@redhat.com, Red Hat, Inc. and others, 2009, 118 pages.

* cited by examiner

*Primary Examiner* — Thomas Lee
*Assistant Examiner* — Xuxing Chen
(74) *Attorney, Agent, or Firm* — Lowenstein Sandler LLP

(57) ABSTRACT

Techniques for determining battery statistics using a system-wide daemon are described herein. According to one embodiment, a power management daemon is configured to collect operating status data of a battery of a data processing system by accessing at least one of firmware and hardware coupled to the battery. The power management daemon is a single system-wide component within the data processing system to provide the operating status data of the battery to multiple clients. The power management daemon is also configured to compute battery statistics based on the collected operating status data of the battery. In response to a query received from one of the clients via an application programming interface (API), the power management daemon is configured to return the battery statistics to the client to enable the client to determine remaining time of the battery until being recharged. Other methods and apparatuses are also described.

17 Claims, 5 Drawing Sheets

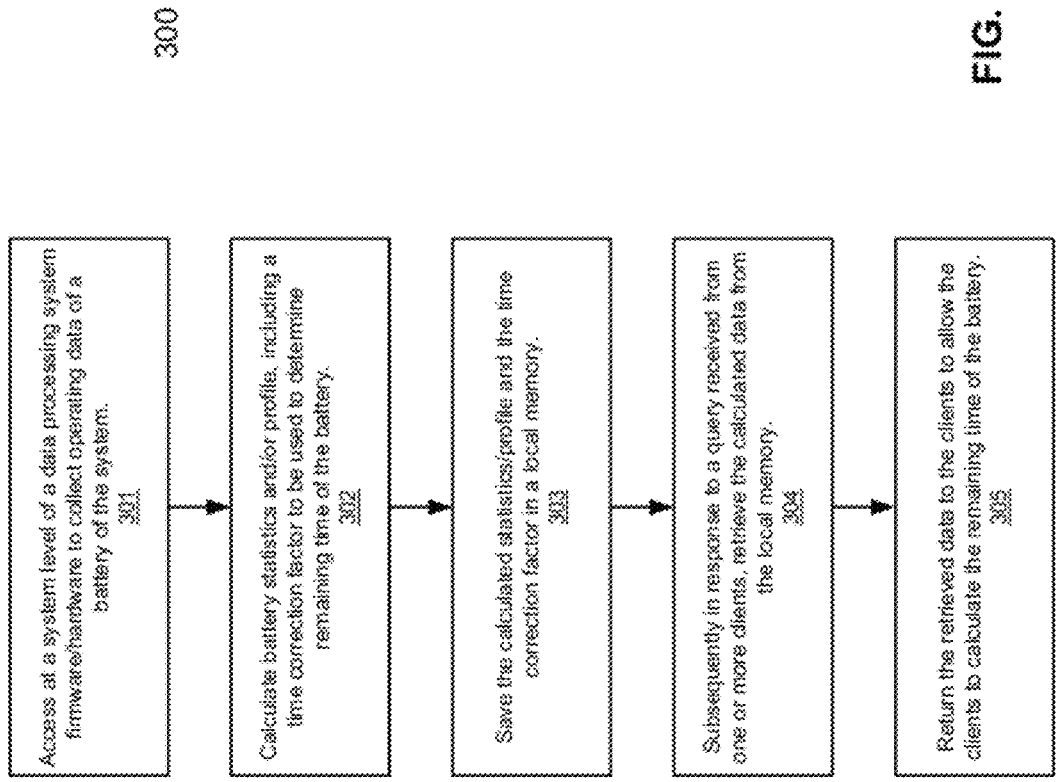

METHODS FOR DETERMINING BATTERY STATISTICS USING A SYSTEM-WIDE DAEMON

COPYRIGHT NOTICES

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The present invention relates generally to power management. More particularly, this invention relates to maintaining battery statistics using a system-wide daemon.

BACKGROUND

In mobile computers such as laptops, the battery and power subsystem often gives time prediction data to the operating system (OS). Such time prediction data can then be forwarded users. This allows the users to find out how much time remaining they have to run before the battery is empty.

Unfortunately, this data is often incorrect, especially when the battery is not new (and ideal), and therefore not behaving as expected. Most BIOS (basic input and output system) and embedded controller (EC) microcode also naively assumes that a battery charges and discharges in a linear way, while the chemistry of certain batteries such as lithium-ion and lithium polymer batteries can be exponential or varied. This affects most modern laptop and netbook computers, which means that the time shown to the users can be wildly inaccurate.

Previous solutions implemented in a power manager such as a gnome-power-manager in Linux listened to the output from the BIOS or EC, and profiled what the battery was reporting, and compared that to the actual measured time that percentage points took to change.

However, this process takes a relative long period of time to complete and has to be performed for each user session (e.g., desktop, login sessions). In the case where four or five people share one laptop, it could be that each user does not maintain enough cycles from 0% to 100% to 0% needed to build up a useful average profile. One immediate way this is shown is when the session gnome-power-manager is shown in a login window, without an accurate time remaining, as nobody ever cycles the power from 100% to 0% on the login screen. It also has the effect of showing different discharge time when switching users, which does not make much sense to a user. It also means that multiple logged in users (in the case of fast user switching) are performing the same data collection and statistics at the same time, which is suboptimal from a power and efficiency point of view.

BRIEF DESCRIPTION OF THE DRAWINGS

The present invention is illustrated by way of example and not limitation in the figures of the accompanying drawings in which like references indicate similar elements.

FIG. 3 is a flow diagram illustrating a method for maintaining battery statistics according to one embodiment.

DETAILED DESCRIPTION

Techniques for determining battery statistics using a system-wide daemon are described herein. In the following description, numerous details are set forth to provide a more thorough explanation of the embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment.

According to certain embodiments of the invention, instead of having each application session to individually determine battery operating status or statistics, a system-wide power management daemon (e.g., as part of an operating system) is maintained and configured to centrally perform such a process. As a result, the battery statistics can be computed and maintained in a more central and accurate manner. In addition, an application programmable interface (API) is also configured to allow an individual session as a client to query the system-wide daemon to obtain the computed battery operating status data.

Figure 1:
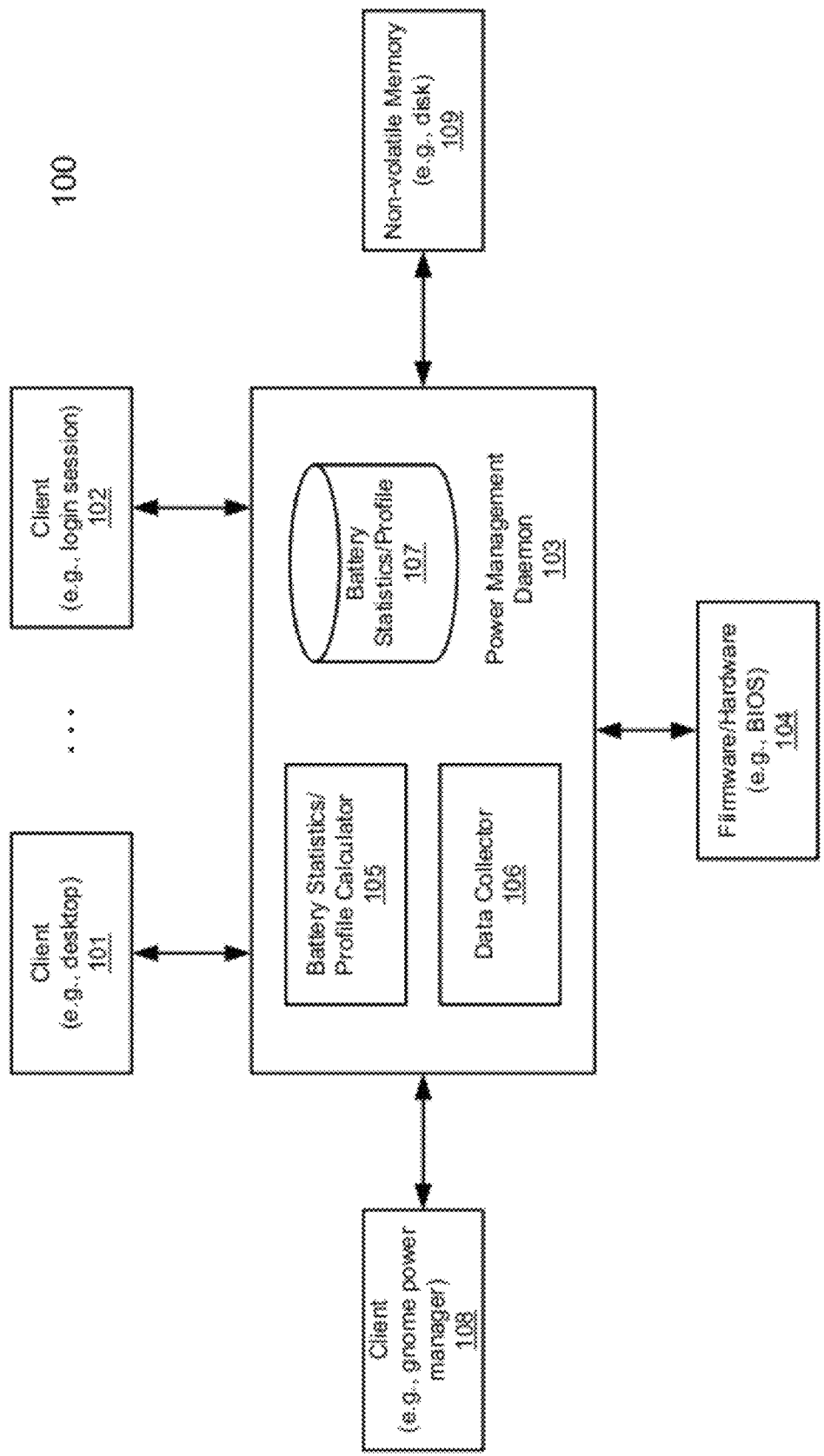
FIG. 1 is a block diagram illustrating a power management system according to one embodiment.

FIG. 1 is a block diagram illustrating an example of a power management system according to one embodiment of the invention. For example, system 100 may be part of a portable computer or portable electronic device (e.g., media player). Referring to FIG. 1, system 100 includes, but is not limited to, one or more session clients 101-102 communicatively coupled to a power management daemon 103 to obtain certain battery statistic data. The power management daemon is configured to access firmware and/or hardware 104 to retrieve certain operating status data regarding a battery of system 100 and to compute the battery statistic data accordingly.

Specifically, according to one embodiment, power management daemon 103 includes a battery statistics and/or profile calculator 105, a data collector 106, and a battery statistics and/or profile repository or database 107, which may be stored in a volatile memory (e.g., random access memory or RAM, also referred to as system memory).

According to one embodiment, data collector 106 is configured to access the firmware/hardware 104 (e.g., BIOS) to collect battery operating status data. The data that is collected represents the amount of charge remaining in the battery relative to the last full charge, which is used to calculate a floating point percentage. If the last full charge or raw charge value is not available then the integer percentage value is recorded from the hardware. The rate of discharge is also collected if it is valid; otherwise it is constructed using the difference between the value of charges over the interrupt time value. Data collector 106 may access the firmware/hardware 104 via an advanced configuration and power interface (ACPI). The battery statistics/profile calculator 105 is configured to compute battery statistics and/or profile in view of the battery operating data collected by data collector 105 and store the information in database 107. In addition, the collected and calculated data may also be stored in a non-volatile memory 109 such as a disk in case the system reboots or shuts down.

Figure 2A:
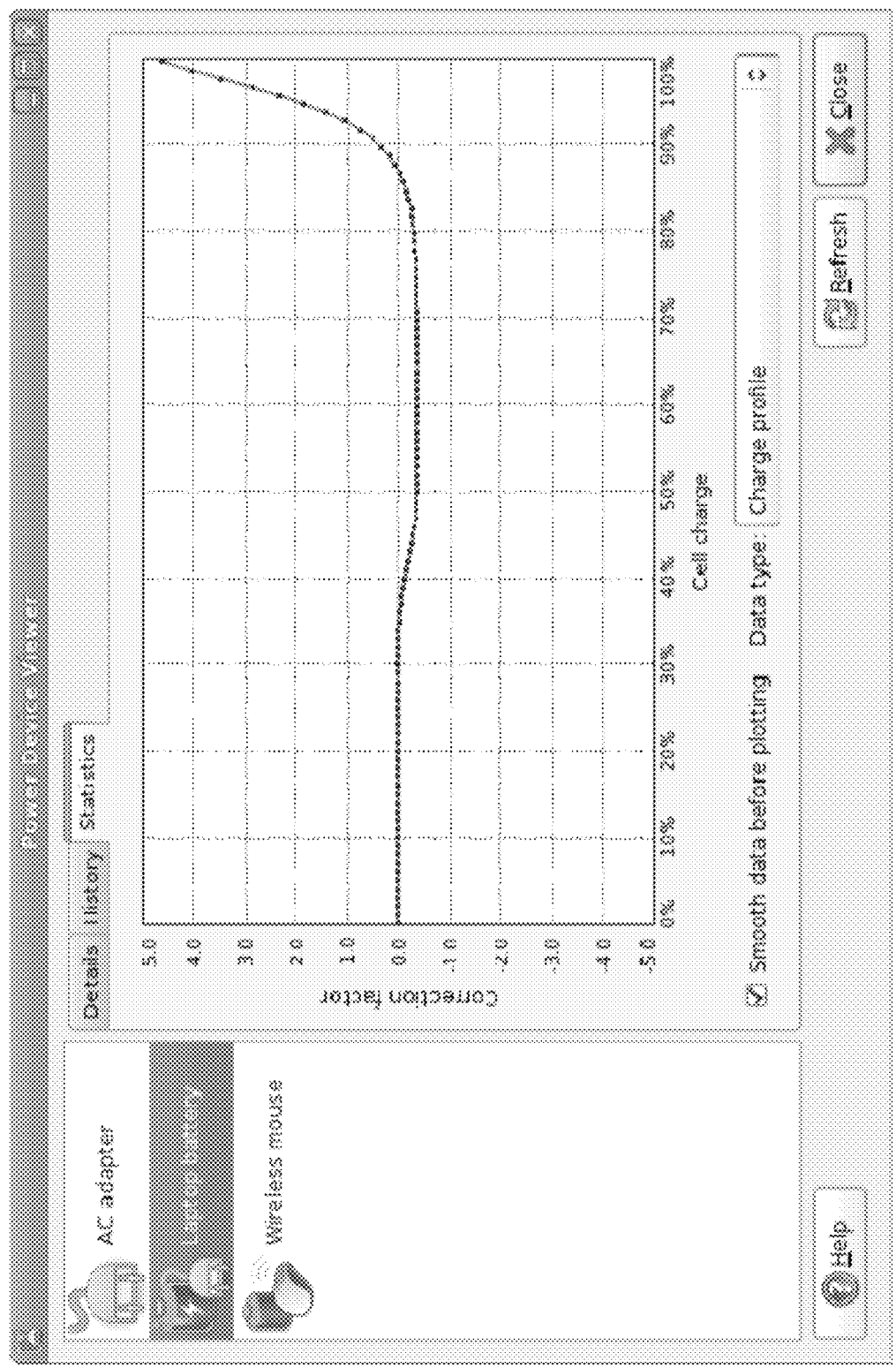
FIGS. 2A-2B are screenshots displaying battery statistics according to some embodiments.
Figure 2B:
Figure 4:
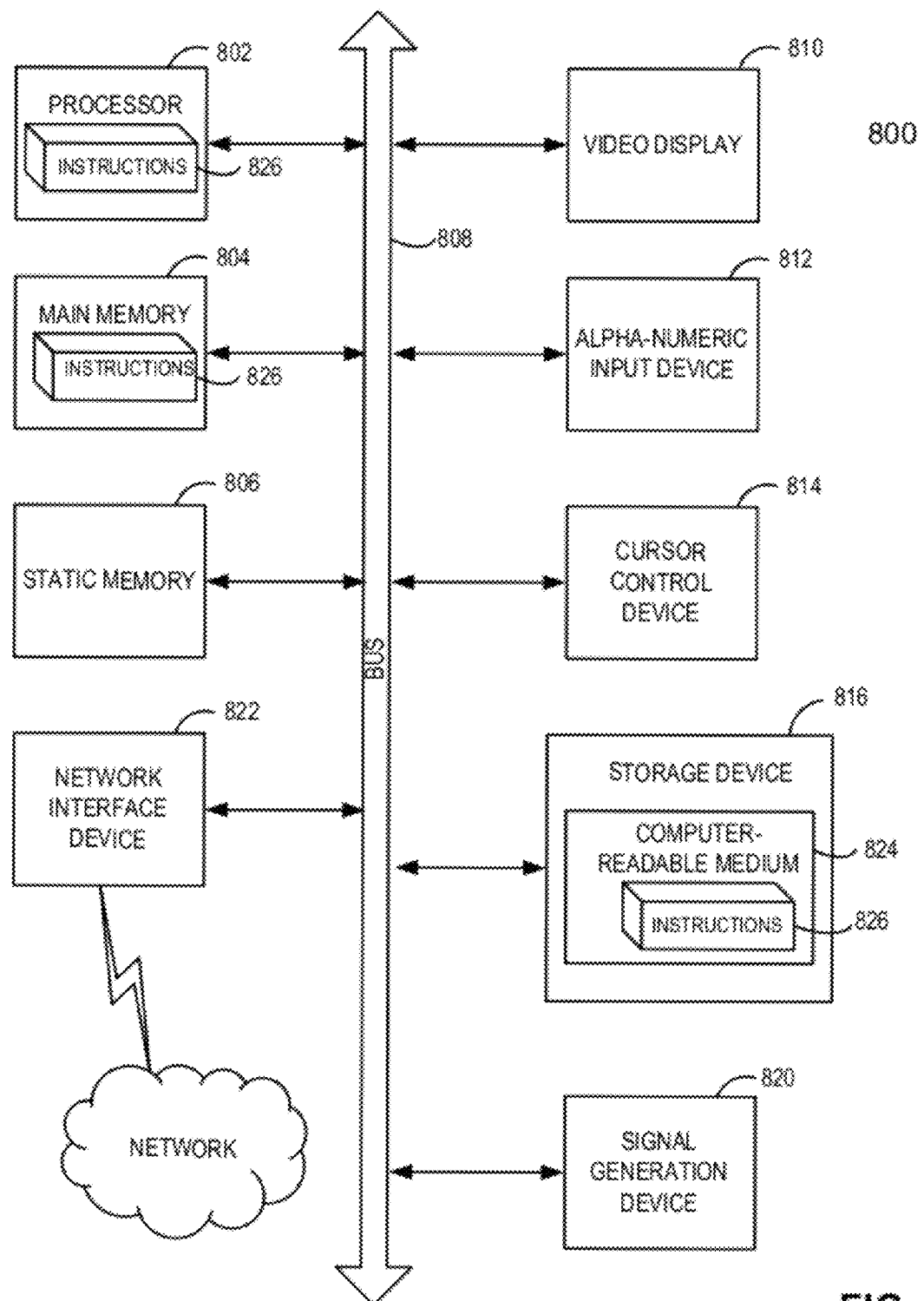
FIG. 4 is a block diagram illustrating a data processing system according to one embodiment.

The calculated battery statistics and/or profile data may be used by clients 101-102 to determine and/or present to users the remaining time of the battery. Alternatively, such data may also be used by power manager 108 client to construct and present more complicated battery operating statuses to users, such as, for example, those as shown in FIGS. 2A-2B.

Furthermore, the calculator 105 is further configured to calculate a correction value or factor to be used to determine the remaining time of the battery in view of the time to charge and/or discharge the battery due to non-linear characteristics of the battery. The correction factor is used by a session as a simple-easy-to-use multiplicator to adjust the time remaining and to display a more accurate time to a user in a graphical user interface (GUI) (e.g., FIGS. 2A-2B). If the system power management daemon can also be programmed to automatically adjust the presented estimated time value and the session does not need to make any adjustment. The former is preferred, as it allows users to switch off the time prediction feature if the battery is broken and not following similar charge and discharge profiles on each iteration.

For example, the percentage charge is used generate a 101 point graph of multiplication factors. If it is estimated that the battery would take 40 seconds to charge from 60% to 61%, and it is measured at 40 seconds, then the charge correction factor for 60 would be 1.0. If it is estimated that the battery would take 40 seconds to charge from 95% to 96%, and it actually takes 120 seconds, the charge factor would be (120/40)=3.0 for the 95 measurement.

By integrating this factor graph from the current position to zero (in the case of discharging) or to 100% (in the case of charging) a cumulative or average factor can be obtained which can simply be multiplied by a time value that the hardware is reporting to get an accurate number. In the case of discharging, this cumulative factor is usually between 0.5 and 1.5, but for charging (especially in the upper percentages) can be anywhere from 0.8 to 8.0. Using this correction gives users a much more accurate time. For example, for partial profile data of 95:1.0, 96:1.2, 97:2.0, 98:2.5, and 99:3.0, if the current percentage charge is 97% and the system is charging, then the charge factor would be (2.0+2.5+3.0)=7.5 at that moment. Such a high charge factor is not uncommon, as batteries charge almost exponentially at approximately 90% after a few months of use. The hardware will be reporting a time remaining of 3 minutes (wildly inaccurate), but this is processed by the session client as 7.5*3.0=22.5 minutes remaining. The addition of the data implies integration of the percentage prediction over time, and allows data collection where percentage steps are missed. This is evident where the hardware charge is mapped to a number of steps, for instance 64 (2 to the power 6, implying 6 bits of working storage), where this is mapped to the percentage. For a perfect battery (with a charge factor of 1.0 for all values) a 64 state profile would be profiled as 1.0, 1.0, 1.0, 0.0, 2.0, 1.0, 1.0, . . . and integrating over all the remaining points allows the system to correct the sub-optimal hardware.

Thus, instead of having clients 101-102 and 108 to individually collect and calculate certain battery statistics and/or profile data, power management daemon 103 is designed to perform such operations in a central manner.

By moving the data collection and statistics operations into a system daemon (e.g., power management daemon 103) battery statistics can be centrally collected for all users or user sessions. Session programs (e.g., clients) can be implemented in a much smaller and simpler scale. These clients can simply query the system daemon 103 for a time correction value for the current percentage, rather than having to collect each value and build a profile individually. Performing data collection and calculation in a central system-wide manner allows all clients to have the same or consistent correction values. As a result, fast user switching works as expected and new users have correct times without having to cycle from 0% to 100% to 0% multiple times in order to figure out the accurate remaining time.

Performing the data collection in the system also allows us to save the data more cleverly. Rather than determining the profile and writing it to a disk straight away (to ensure it is not lost in the case of power loss) the data can be written to the disk 109 if the daemon 103 is unloaded (e.g., on power down) or if the main system battery is at a low-power state. This avoids waking up the disk for every percentage change and saves power as a result.

By providing the interface for clients to query the correction factor, a client is also allowed to choose from a raw data value presented by the hardware and to decide whether to multiply the data value by a single floating point number, etc. Thus, the time prediction is not automatically applied to the time remaining value, as this is left for the client to decide if prediction should be used. The daemon will also not provide a prediction factor (e.g., by setting it to 1.0) if the accuracy of the prediction is not high enough. High enough could be as simple as the number of data points for this charge percentage has to be above a preset number, but it could also take into account standard deviation from the previous readings. When the initial profile is being created, the charge and discharge times do not have lots of data to average to find the typical discharge or charge profile of the battery.

For example, if during the first time the profile is being created, the user is burning a DVD, encoding some video, and downloading a large file, it may not reflect accurately the battery profile. However, when for the most part the user will be surfing the Web, the computer's batteries will last much longer and not be under such heavy current drain. For this reason, the statistics module will only attempt a prediction when the confidence of data is "good enough". Thus, rather than telling the user that it will take 3 days to charge the battery based on the first atypical reading, the system may wait until there is sufficient data to make a reasonable and helpful prediction factor, and until then to show a prediction factor of 1.0 which means the hardware generated value will not be changed. Note that some or all of the components as shown in FIG. 1 may be implemented in software, hardware, or a combination of both.

FIG. 3 is a flow diagram illustrating a method for determining and maintaining battery statistics and/or profile according to one embodiment of the invention. Note that method 300 may be performed by processing logic which may include software, hardware, or a combination of both. For example, method 300 may be performed by power management daemon 103 of FIG. 1. Referring to FIG. 3, at block 301, from a system level of a data processing system processing logic accesses the firmware and/or hardware (e.g., BIOS) to collect battery operating status data from a battery of the data processing system. At block 302, battery statistics and/or profile is computed within the system level (e.g., by a power management daemon in a central manner). In addition, a correction factor is also calculated. At block 303, this data is to be used to determine the remaining time of the battery and saved to a local memory as described above. Subsequently when a query is received from a client, at block 304, the calculated battery data is retrieved from the local memory. The query may be received via an API published by a power management daemon from a client such a gnome power manager. At block 305, the retrieved data is returned the client to allow the client to calculate the remaining time of the battery. Note that the returned data may be calculated data or alternatively, raw data collected from the firmware/hardware, dependent upon the specific circumstances. Also note that operations involved in blocks 301-303 and blocks 304-305 may be performed by the same or different processes or threads independently and substantially concurrently. Other operations may also be performed.

FIG. 5 illustrates a diagrammatic representation of a machine in the exemplary form of a computer system 800 within which a set of instructions, for causing the machine to perform any one or more of the methodologies discussed herein, may be executed. In alternative embodiments, the machine may be connected (e.g., networked) to other machines in a LAN, an intranet, an extranet, and/or the Internet. The machine may operate in the capacity of a server or a client machine in client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The exemplary computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage device 816, which communicate with each other via a bus 808.

Processing device 802 represents one or more general-purpose processing devices such as a microprocessor, a central processing unit, or the like. More particularly, the processing device may be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 is configured to execute the instructions 826 for performing the operations and steps discussed herein.

The computer system 800 may further include a network interface device 822. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), and a signal generation device 820 (e.g., a speaker).

The data storage device 816 may include a computer-accessible storage medium 824 (also known as a machine-readable storage medium or a computer-readable medium) on which is stored one or more sets of instructions or software 826 embodying any one or more of the methodologies or functions described herein. The software 826 may also reside, completely or at least partially, within the main memory 804 and/or within the processing device 802 during execution thereof by the computer system 800, the main memory 804 and the processing device 802 also constituting machine-accessible storage media. The software 826 may further be transmitted or received over a network via the network interface device 822.

Thus, techniques for determining battery statistics using a system-wide daemon have been described herein. Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present invention also relate to an apparatus for performing the operations herein. This apparatus may be specially constructed for the required purposes, or it may comprise a general-purpose computer selectively activated or reconfigured by a computer program stored in the computer. Such a computer program may be stored in a computer readable medium. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., carrier waves, infrared signals, digital signals, etc.)), etc.

The algorithms and displays presented herein are not inherently related to any particular computer or other apparatus. Various general-purpose systems may be used with programs in accordance with the teachings herein, or it may prove convenient to construct more specialized apparatus to perform the required method operations. The required structure for a variety of these systems will appear from the description above. In addition, embodiments of the present invention are not described with reference to any particular programming language. It will be appreciated that a variety of programming languages may be used to implement the teachings of embodiments of the invention as described herein.

In the foregoing specification, embodiments of the invention have been described with reference to specific exemplary embodiments thereof. It will be evident that various modifications may be made thereto without departing from the broader spirit and scope of embodiments of the invention as set forth in the following claims. The specification and drawings are, accordingly, to be regarded in an illustrative sense rather than a restrictive sense.

What is claimed is:

1. A method comprising:
collecting, by a power management daemon, operating status data of a battery of a data processing system by accessing at least one of firmware or hardware coupled to the battery, the power management daemon to provide the operating status data of the battery to a plurality of clients;
computing, by the power management daemon, battery statistics based on the collected operating status data of the battery;
determining a plurality of correction values, each of the plurality of correction values corresponding to an amount of battery charge remaining, and adjusting a remaining time of the battery based on the amount of battery charge remaining and the corresponding one of the plurality of correction values; and
in response to a query received from one client of the plurality of clients via an application programming interface (API), the power management daemon returning the battery statistics and the one of the plurality of correction values corresponding to the amount of battery charge remaining to the one client to enable the one client to determine the remaining time of the battery until being recharged.

2. The method of claim 1, wherein the one client is a power manager associated with one of a desktop session or a login session that provides the remaining time of the battery to a user.

3. The method of claim 2, further comprising collecting the operating status data of the battery by accessing a basic input and output system (BIOS) of the data processing system via an advanced configuration and power interface (ACPI).

4. The method of claim 3, further comprising storing the battery statistics in a local memory, retrieving the battery statistics from the local memory, and returning the battery statistics to the one client in response to the query.

5. The method of claim 4, further comprising saving the battery statistics to a disk in response to a request to reload the power management daemon or shut down the data processing system, such that the battery statistics persist after reloading the power management daemon or rebooting the data processing system.

6. The method of claim 1, wherein the power management daemon is a single system wide component within the data processing system.

7. A non-transitory computer readable medium including instructions that, when executed by a processing system, cause the processing system to perform a method comprising:
collecting, by a power management daemon, operating status data of a battery of a data processing system by accessing at least one of firmware or hardware coupled to the battery, the power management daemon to provide the operating status data of the battery to a plurality of clients;
computing, by the power management daemon, battery statistics based on the collected operating status data of the battery;
determining a plurality of correction values, each of the plurality of correction values corresponding to an amount of battery charge remaining, and adjusting a remaining time of the battery based on the amount of battery charge remaining and the corresponding one of the plurality of correction values; and
in response to a query received from one client of the plurality of clients via an application programming interface (API), the power management daemon returning the battery statistics and the one of the plurality of correction values corresponding to the amount of battery charge remaining to the one client to enable the one client to determine the remaining time of the battery until being recharged.

8. The computer readable medium of claim 7, wherein the one client is a power manager associated with one of a desktop session or a login session that are configured to provide the remaining time of the battery to a user.

9. The computer readable medium of claim 8, further comprising collecting the operating status data of the battery by accessing a basic input and output system (BIOS) of the data processing system via an advanced configuration and power interface (ACPI).

10. The computer readable medium of claim 9, wherein the method further comprises storing the battery statistics in a local memory, retrieving the statistics data from the local memory, and returning the statistics data to the client.

11. The computer readable medium of claim 10, wherein the method further comprises saving the battery statistics to a disk in response to a request to reload the power management daemon or shut down the data processing system, such that the battery statistics persist after reloading the power management daemon or rebooting the data processing system.

12. The computer readable medium of claim 7, wherein the power management daemon is a single system wide component within the data processing system.

13. An apparatus for determining and maintaining battery statistics, comprising:
a data collector to collect operating status data of a battery of a data processing system by accessing at least one of firmware or hardware coupled to the battery, and to provide the operating status data of the battery to a plurality of clients; and
a statistics calculator coupled to the data collector to compute battery statistics based on the collected operating status data of the battery and determine a plurality of correction values, each of the plurality of correction values corresponding to an amount of battery charge remaining, and adjusting a remaining time of the battery based on the amount of battery charge remaining and the corresponding one of the plurality of correction values, wherein in response to a query received from one client of the plurality of clients via an application programmable interface (API), the statistics calculator is configured to return the battery statistics and the one of the plurality of correction values corresponding to the amount of battery charge remaining to the one client to enable the one client to determine the remaining time of the battery until being recharged.

14. The apparatus of claim 13, wherein the one client is a power manager associated with one of a desktop session or a login session that are configured to provide the remaining time of the battery to a user.

15. The apparatus of claim 14, wherein the data collector collects operating status data of the battery by accessing a basic input and output system (BIOS) of the data processing system via an advanced configuration and power interface (ACPI).

16. The apparatus of claim 15, wherein the data collector stores the battery statistics in a local memory, wherein in response to the query, the statistics calculator retrieves the statistics data from the local memory and returns the statistics data to the client.

17. The apparatus of claim 16, wherein the data collector saves the battery statistics to a disk in response to a request to reload the data collector or shut down the data processing system, such that the battery statistics persist after reloading the data collector or rebooting the data processing system.

* * * * *